United States Patent
Takagi

(10) Patent No.: US 8,603,579 B2
(45) Date of Patent: Dec. 10, 2013

(54) TUBULAR BODY AND METHOD FOR PRODUCING THE SAME

(75) Inventor: Takashi Takagi, Gifu (JP)

(73) Assignee: Ibiden Co., Ltd., Ogaki-Shi (JP)

( * ) Notice: Subject to any disclaimer, the term of this patent is extended or adjusted under 35 U.S.C. 154(b) by 1102 days.

(21) Appl. No.: 12/369,391

(22) Filed: Feb. 11, 2009

(65) Prior Publication Data

US 2009/0220040 A1 Sep. 3, 2009

(30) Foreign Application Priority Data

Feb. 29, 2008 (JP) .................................. 2008-050324

(51) Int. Cl.
*B05D 3/02* (2006.01)
(52) U.S. Cl.
USPC .................. 427/228; 326/409; 428/297.1
(58) Field of Classification Search
USPC ............................................ 376/409; 428/297
See application file for complete search history.

(56) References Cited

U.S. PATENT DOCUMENTS

| | | | |
|---|---|---|---|
| 5,391,428 A * | 2/1995 | Zender | 428/34.4 |
| 5,491,000 A | 2/1996 | Hocquellet et al. | |
| 2006/0003098 A1 * | 1/2006 | Rashed et al. | 427/228 |
| 2006/0039524 A1 * | 2/2006 | Feinroth et al. | 376/409 |
| 2007/0189952 A1 | 8/2007 | Easler et al. | |

FOREIGN PATENT DOCUMENTS

| | | |
|---|---|---|
| JP | 03-252360 | 11/1991 |
| JP | 05-043364 | 2/1993 |
| JP | 5-059350 | 3/1993 |
| JP | 05-232289 | 9/1993 |
| JP | 06-009270 | 1/1994 |
| JP | 6-116067 | 4/1994 |
| JP | 10-119140 | 5/1998 |
| JP | 2007-126637 | 5/2007 |
| JP | 2008-501977 | 1/2008 |
| KR | 20070020128 | 2/2007 |
| KR | 0776252 | 11/2007 |

OTHER PUBLICATIONS

Extended European Search Report for corresponding EP Application No. 09002634.5-2208, May 18, 2011.
Korean Office Action for corresponding KR Application No. 10-2009-0016588, Nov. 17, 2010.
Japanese Office Action for corresponding JP Application No. 2008-050324, Oct. 04, 2011.
Japanese Office Action for corresponding JP Application No. 2008-050324, May 8, 2012.

* cited by examiner

*Primary Examiner* — Timothy A Brainard
(74) *Attorney, Agent, or Firm* — Ditthavong Mori & Steiner, P.C.

(57) ABSTRACT

A tubular body includes a tubular fiber-reinforced carbonaceous substrate and an SiC layer. The tubular fiber-reinforced carbonaceous substrate includes an aggregate formed of ceramic fibers, and a carbonaceous material filled in interstices between the ceramic fibers. The SiC layer is formed at least on an outer surface of the tubular fiber-reinforced carbonaceous substrate in which silicon atoms are diffused from a boundary region between the fiber-reinforced carbonaceous substrate and the SiC layer to an inside of the fiber-reinforced carbonaceous substrate.

14 Claims, 2 Drawing Sheets

TUBULAR BODY AND METHOD FOR PRODUCING THE SAME

CROSS-REFERENCE TO RELATED APPLICATION

This application claims priority under 35 U.S.C. §119 to Japanese Patent Application No. 2008-050324, filed on Feb. 29, 2008, the entire contents of which are incorporated herein by reference.

BACKGROUND OF THE INVENTION

1. Field of the Invention

The present invention relates to a tubular body and a method for producing the tubular body.

2. Description of the Related Art

In many nuclear reactors today, nuclear fuel is contained in a sealed metal tube called a "cladding tube", and this cladding tube is generally made of a zirconium alloy or a steel alloy. The cladding tube is designed so that any radioactive gas and solid fission product are surely held in the tube and not released to a coolant during normal operation or during a conceivable accident. If the cladding tube is damaged, heat, hydrogen and ultimately the fission product can be released to the coolant.

Problems with conventional cladding tube are known. For example, the metal cladding tube is relatively soft, and may come into contact with a fragment which sometimes flows into a cooling system and contacts with fuel, so that the metal cladding tube wears or corrodes. As a result, such wear or corrosion is likely to lead to damage of a boundary wall of a metal containment, and consequently to release of the fission product into the coolant. Further, the metal cladding tube exothermicly react with hot water of 1,000° C. or higher to result in the addition of further heat to fission product decay heat generated by the nuclear fuel. This additional heat from the cladding further amplifies the seriousness and duration period of an accident, for example, as occurred at Three Mile Island.

JP-A-2008-501977 describes a multilayer ceramic tube (cladding tube) including an inner layer of monolithic SiC; an intermediate layer as a composite material in which SiC fibers are surrounded by a SiC matrix; and an outer layer of SiC. The contents of JP-A-2008-501977 are incorporated herein by reference in their entirety.

However, in such a cladding tube composed of SiC as a whole, the monolithic SiC layer is formed by Chemical Vapor Deposition (CVD) or the like, and all of the inner layer, the intermediate layer and the outer layer have high rigidity, so that particularly, strain generated by an immediate change in temperature which occurs at the start of an operation can develop into a crack penetrating front to back sides of the cladding tube.

Further, in order to prevent such a problem, the JP-A-2008-501977 proposes to provide each fiber with double coatings including an inside pyrolytic carbon sublayer for preventing the development of the crack and an outside SiC sublayer for protecting carbon from an oxidizing environment. However, in order to provide each fiber with the double coatings, film forming has to be performed on a fiber surface in a state where each fiber is dispersed. If each fiber can not be sufficiently dispersed, it can be coated with only either one of the above-described sublayers. Accordingly, the SiC fiber and the SiC matrix come into contact with each other to cause that the pyrolytic carbon layer would not sufficiently function.

Further, in JP-A-2008-501977, the SiC matrix is formed by two processes of providing the SiC fiber surface with the coatings and multistage treatment in which CVD or polymer penetration/pyrolysis are repeated. Such a production method requires repetition of treatment many times, resulting in complicated processes.

SUMMARY OF THE INVENTION

According to an aspect of the present invention, a tubular body includes a tubular fiber-reinforced carbonaceous substrate and an SiC layer. The tubular fiber-reinforced carbonaceous substrate includes an aggregate formed of ceramic fibers, and a carbonaceous material filled in interstices between the ceramic fibers. The SiC layer is formed at least on an outer surface of the tubular fiber-reinforced carbonaceous substrate. Silicon atoms are diffused from a boundary region between the fiber-reinforced carbonaceous substrate and the SiC layer to an inside of the fiber-reinforced carbonaceous substrate.

According to another aspect of the present invention, there is provided a method for producing a tubular body. An aggregate is formed with ceramic fibers. Pyrolytic carbon is vapor-deposited on the aggregate to form a fiber-reinforced carbonaceous substrate. The pyrolytic carbon positioned at least on an outer surface of the fiber-reinforced carbonaceous substrate is converted to SiC by reaction with an SiO gas to form an SiC layer. Silicon atoms are diffused from a boundary region between the fiber-reinforced carbonaceous substrate and the SiC layer to an inside of the fiber-reinforced carbonaceous substrate in the converting step.

BRIEF DESCRIPTION OF THE DRAWINGS

The above and other aspects of the present invention will become more apparent and more readily appreciated from the following description of exemplary embodiments of the present invention taken in conjunction with the attached drawings, in which.

DETAILED DESCRIPTION

Figure 1:
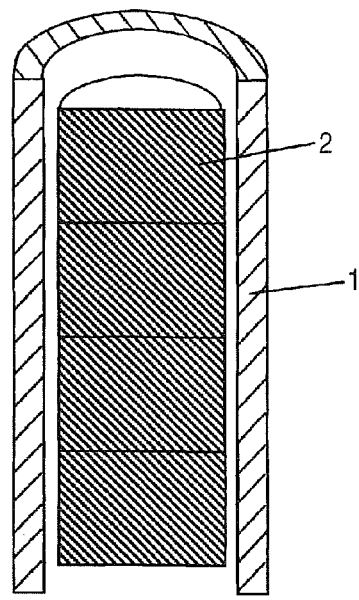
FIG. 1 is a view schematically showing a section taken on a plane parallel to a central axis of a tubular body in a state where a nuclear fuel is covered with the tubular body used as a cladding tube according to an exemplary embodiment.

The embodiments will now be described with reference to the accompanying drawings, wherein like reference numerals designate corresponding or identical elements throughout the various drawings.

The tubular body according to an exemplary embodiment of the present invention usually has a cylindrical body opened at an end portion, but may be closed at the end portion depending on the design of the nuclear reactor. Hereinafter, there will be described respective portions of the tubular body according to an exemplary embodiment in detail.

The fiber-reinforced carbonaceous substrate is a tubular body including an aggregate formed of ceramic fibers and a carbonaceous material filled in interstices between the ceramic fibers.

Herein, the carbonaceous material means a material substantially composed of carbon, and may be pyrolytic carbon, glassy carbon or the like. In particular, pyrolytic carbon is preferred.

The pyrolytic carbon has good adhesion properties to ceramic fibers, particularly to SiC fibers, and moreover, can provide a high-purity carbonaceous material by using a high-purity raw material. Chemical Vapor Infiltration (CVI) for vapor depositing the pyrolytic carbon is performed on the aggregate, thereby being able to form the fiber-reinforced carbonaceous substrate with the carbonaceous material filled in the interstices between the ceramic fibers. The CVI is a vacuum film forming method based on the same principle as CVD.

The carbonaceous material of the fiber-reinforced carbonaceous substrate is unnecessary to densely fill all the interstices between the ceramic fibers of the aggregate, and may fill only a surface layer of the aggregate, because even when only the surface layer portion is densely filled, an anchor effect between the SiC layer and the ceramic fibers can be sufficiently obtained.

In the fiber-reinforced carbonaceous substrate, the mass ratio of the ceramic fibers to the whole substrate is preferably from about 10% to about 50%, and more preferably from about 20% to about 30%. Less than about 10% of the ratio results in a decrease in strength of the substrate, whereas exceeding about 50% of the ratio causes difficulty to hold the ceramic fiber while being compressed before the CVI treatment, resulting in easy deformation in shape.

The thickness of the fiber-reinforced carbonaceous substrate is preferably from about 0.3 mm to about 2 mm, and more preferably from about 0.5 mm to about 1.2 mm. Less than about 0.3 mm of the thickness may result in difficulty to have sufficient strength, whereas exceeding about 2 mm of the thickness results in tendency to fail to sufficiently transfer heat to the coolant.

The SiC layer means a layer substantially composed of SiC, and usually means a layer containing SiC in an amount of 95% by mass or more.

The SiC layer can be obtained by converting the carbonaceous material on a surface of the fiber-reinforced carbonaceous substrate to SiC by reaction with an SiO gas. The SiO gas is obtained, for example, by disposing an silicon mixture of various kinds such as Si powder-$SiO_2$ powder, SiC powder-$SiO_2$ powder or carbon powder-$SiO_2$ powder as a source on a bottom of a furnace, disposing the fiber-reinforced carbonaceous substrate above it, and performing heat treatment at 1,300° C. to 2,300° C.

Figure 2:
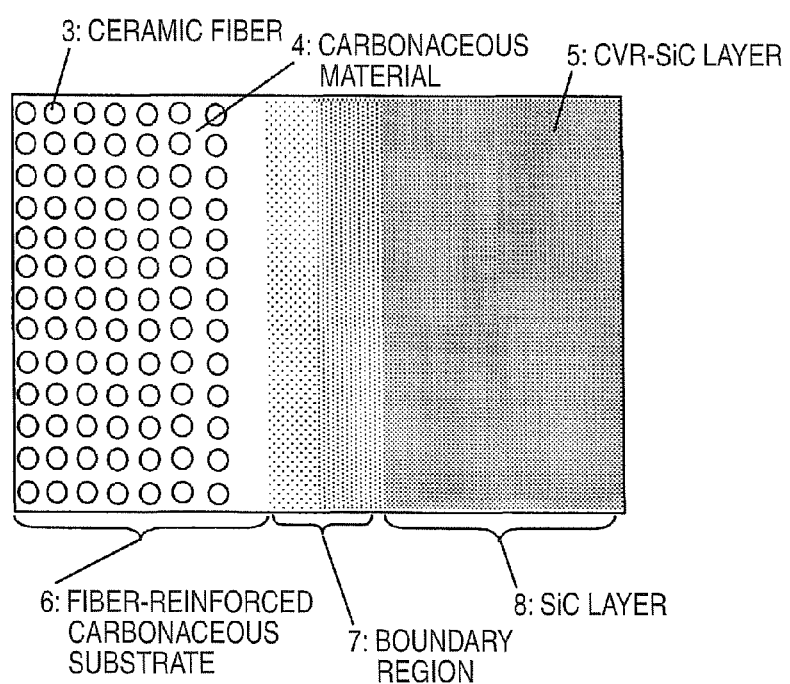
FIG. 2 is a view schematically showing a section in an arbitrary direction of a tubular body according to an exemplary embodiment.

The SiC layer 8 (CVR-SiC layer 5) thus obtained by the reaction conversion has an unclear boundary between the SiC layer 8 and the fiber-reinforced carbonaceous substrate 6, and silicon atoms are diffused from the boundary region 7 to an inside of the fiber-reinforced carbonaceous substrate (as shown in FIG. 2, CVR-SiC forms the boundary region 7 and the SiC layer 8 in such a manner that its density gradually increases from the inside of the tube to the outside thereof). In other words, in the boundary region 7 between the fiber-reinforced carbonaceous substrate 6 and the SiC layer 8, the amount of silicon gradually increases from the inside to the outside. In the case of the CVD-SiC layer formed by CVD or the like, diffusion of silicon atoms from a boundary region with the fiber-reinforced carbonaceous substrate to the inside of the fiber-reinforced carbonaceous substrate is not observed.

SiC has a thermal expansion coefficient of 2 to 3 times that of the pyrolytic carbon so that SiC has a problem of being easily separable. However, the CVR-SiC layer is originally obtained by converting the carbonaceous material to SiC, and has no clear boundary with the carbonaceous material 4 so that this configuration has an advantage that interlayer separation is not likely to occur.

Further, in use for cladding tubes for coolants such as water and molten metal which have reactivity with carbon, an SiC layer may be newly deposited on the surface of the SiC layer according to the exemplary embodiment. Although a method for depositing the SiC layer is not limited, it is preferred to form a CVD-SiC layer by the CVD method. The CVD-SiC layer is higher in density, so that it has low reactivity with a heating medium such as cooling water or molten metal and has a high shielding effect. Accordingly, the tubular body having a long life can be provided.

Further, if the CVD-SiC layer is further laminated on the surface of the cladding tube, the CVR-SiC layer and the CVD-SiC layer on the surface thereof are formed of the same material at an interface therebetween so that they are approximately equal in thermal expansion and have strong adhesive force. Accordingly, there is also an advantage that the SiC layer in which interlayer separation is not likely to occur is obtained.

The thickness of the SiC layer according to the exemplary embodiment is preferably from 10 μm to 500 μm, and more preferably from 20 μm to 100 μm. With this range, the advantages of the exemplary embodiment can be sufficiently exhibited. However, less than 10 μm of the thickness results in the tendency of the carbonaceous material layer to expose by abrasion, whereas exceeding 500 μm of the thickness may result in a decrease in the carbonaceous material of the fiber-reinforced carbonaceous substrate.

If the CVD-SiC layer is further coated (laminated) on the SiC layer according to the exemplary embodiment, the thickness thereof is preferably from 2 μm to 300 μm, and more preferably from 10 μm to 100 μm. In the case of less than 2 μm, thin portions are liable to occur in the CVD-SiC layer to cause failure to obtain a sufficient shielding effect. In the case of exceeding 300 μm, the dimension error due to unevenness in thickness of the formed layer increases, and moreover, modifying processing tends to become difficult because SiC is hard.

Raw materials for the ceramic fibers 3 constituting the aggregate include SiC, carbon, ZrC and the like. SiC is preferred among these, and ZrC is particularly preferred in use for ultrahigh-temperature gas reactors. These are difficult to react with the coolant, and also have heat resistance.

Although the thickness of the ceramic fibers is not particularly limited, the ceramic fibers having a diameter of 10 μm to 20 μm can be suitably used. As a strand, there can be suitably utilized one composed of 100 to 1,000 fibers.

As for the aggregate constituting the fiber-reinforced carbonaceous substrate of the tubular body according to the exemplary embodiment, there is no particular limitation on its structure, as long as it is formed in a tubular form (a tubular shape). However, it is preferably formed by winding method using strands of ceramic fibers, or by braiding strands into a hollow braid mesh body. In the case of the braid, it is formed by weaving strands composed of ceramic fibers so as to be aligned diagonally to a central axis of an inner core die, or by triaxial weave using strands parallel to the central axis.

According to the configuration as described above, the ceramic fiber surface contacts with the carbonaceous material so that a crack which occurs by thermal stress can be stopped at the ceramic fiber surface. Accordingly, a crack penetrating from the inside to outside of the tubular body is not likely to occur. Moreover, pretreatment for providing each ceramic fiber with a coating is unnecessary so that the process can be simplified. Furthermore, a nuclear reactor can be operated at higher temperature by improvement in performance of the tubular body so that the nuclear reactor having high energy efficiency can be provided, and the working life thereof can be prolonged.

In particular, the tubular body may have a simple structure and be difficult to break in a high-temperature gas reactor using a coolant having no fear of reacting with carbon, and the like.

The winding methods for forming the tubular body according to the exemplary embodiment include a sheet winding method which includes winding a sheet such as a woven fabric, and the like, as well as a filament winding method which includes winding a filament.

A method for producing the tubular body according to an embodiment of the present invention will be described below in detail (see FIG. 2).

(1) Aggregate Forming Step

The aggregate of the tubular body according to the exemplary embodiment can be obtained by winding ceramic fibers around an inner core die having a specific size by a method such as filament winding or braiding.

In a braid form, it is particularly advantageous to constitute the aggregate by triaxial weave including warp yarns and two pairs of weft yarns rounded in the opposite direction to each other. In the case of the triaxial weave, the warp yarns are added as braces to the two pairs of weft yarns, thereby being able to provide the tubular body which has high rigidity and in which tension applied to the individual fibers is suppressed.

The ceramic fibers may be any fibers. For example, High-Nicalon manufactured by Nippon Carbon Co., Ltd. can be utilized as the SiC fibers. Although a material of the inner core die is not particularly limited, it is advantageous to use an inner core die made of graphite so as not to react in a CVD step described later and the like.

In order to make it easy to perform mold release of the aggregate, the inner core die is preferably coated with a release agent. Although the kind of release agent is not particularly limited, it is advantageous to use a graphite powder or graphite-based release agent which makes easy mold release after CVD and has no fear of impurity incorporation.

(2) Carbonaceous Material Forming Step

The carbonaceous materials include pyrolytic carbon obtained by CVI, glassy carbon obtained by repeating impregnation of a resin solution as a carbon precursor, followed by burning, and the like. Among the above, the pyrolytic carbon obtained by CVI (CVD) is particularly advantageous, because the high-purity carbonaceous material is easily obtained by upgrading the purity of a raw material gas, and moreover, the carbonaceous material is obtained by single treatment of continuously supplying the raw material gas.

The CVI (CVD) is performed in a CVI (CVD) furnace at a degree of vacuum of 1 kPa to 30 kPa and a temperature of about 1,200° C. to 1,900° C., using a hydrocarbon gas as a raw material and hydrogen as a carrier gas.

Further, in order to form an SiC layer having a sufficient thickness in a subsequent SiC layer forming step, the treatment may be continued after the carbonaceous material has been filled in interstices between the fibers of the aggregate to allow a thick carbonaceous material layer composed of only the pyrolytic carbon to grow on a surface of the fiber-reinforced carbonaceous substrate. When the CVI (CVD) treatment is stopped at the stage where the carbonaceous material has been filled in interstices between the fibers of the aggregate, only a carbonaceous layer having a thickness of at most about 100 μm composed of only the pyrolytic carbon is formed on the surface of the fiber-reinforced carbonaceous substrate. However, the carbonaceous material layer composed of only the pyrolytic carbon and necessary for obtaining the SiC layer having a sufficient thickness can be obtained by continuing the treatment more.

Figure 3:
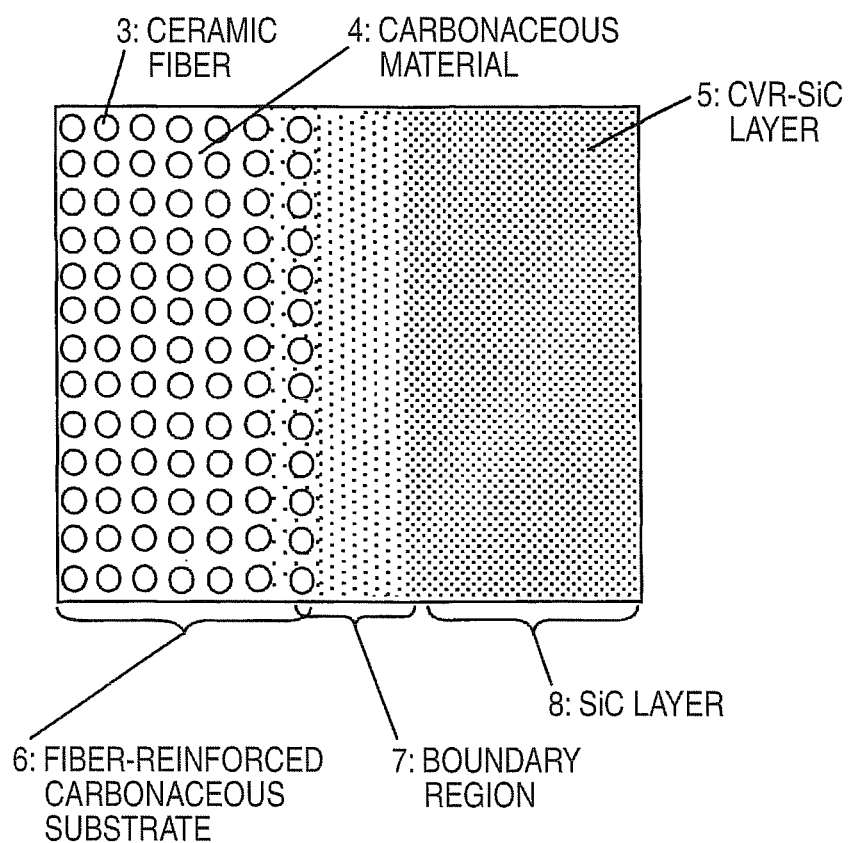
FIG. 3 is a view schematically showing a section in an arbitrary direction of tubular body according to another exemplary embodiment of the present invention.

If the carbonaceous material layer composed of only the pyrolytic carbon and necessary for obtaining the SIC layer having a sufficient thickness is not formed in the carbonaceous material forming step, a tubular body in which silicon atoms are diffused in an inside of the carbonaceous material of the fiber-reinforced carbonaceous substrate, as shown in FIG. 3, can be obtained.

(3) SiC Layer Forming Step

As for an intermediate product produced as described above, a surface of the pyrolytic carbon is subjected to the following chemical vapor reaction (CVR) in an $SiO_2$ gas, using a reaction furnace of atmospheric pressure and under a temperature of 1,200° C. to 2,300° C., thereby being able to obtain a CVR-SiC layer composed of reaction-converted SiC.

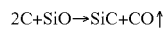

The SiC layer may be formed not only on an outer surface of the fiber-reinforced carbonaceous substrate but also on an inner surface thereof.

If the SiC layers are formed on both surfaces, the tubular aggregate is placed in a CVD furnace as it is, and the pyrolytic carbon is subjected to the CVI (CVD) treatment, followed by SiC conversion treatment in a reaction furnace, thereby reaction-converting the outer surface and the inner surface to perform SiC conversion. Further, the SiC layers can also be formed on both surfaces by inserting an inner core die into the tubular aggregate, subjecting the pyrolytic carbon to the CVI (CVD) treatment in the CVD furnace to obtain the fiber-reinforced carbonaceous substrate, then, drawing the inner core die out, and reaction-converting the outer surface and the inner surface in a reaction furnace to perform SiC conversion.

As described above, according to the exemplary embodiment, the tubular body having the CVR-SiC layer on the outer surface can be obtained by three steps of (1) the aggregate forming step, (2) the carbonaceous material forming step and (3) the SiC layer forming step. Therefore, the process can be largely simplified compared to the related-art technique, for example, that described in JP-A-2008-501977.

Furthermore, in order to increase airtightness of the CVR-SiC layer, a CVD-SiC layer may be deposited thereon. It is obtained by using methyltrichlorosilane (MTS: $CH_3Cl_3Si$) as a raw material gas, and performing deposition in a CVD furnace at a degree of vacuum of 5 kPa to 30 kPa and a temperature of about 1,000° C. to 1,400° C.

EXAMPLES

A more specific configuration of the tubular body according to an exemplary embodiment and a production methods thereof will be described with reference to the following examples. The present invention is not limited to the production method described in the examples.

(1) Aggregate Forming Step

First, a rod-like inner core die for forming a triaxial weave braid is prepared. As the inner core die, an inner core die made of graphite is used so as not to react in a CVD step.

The size (diameter) of the inner core die is approximately equal to the size of a nuclear fuel (diameter: 8 to 11 mm).

Ribbon-like strands are each formed by bundling a plurality of SiC fibers, and the strands are woven along an outer periphery of a forming die by a three-dimensional braiding method to form a braid. A commercially available automatic loom (for example, TWM-32C, TRI-AX, manufactured by Howa Machinery, Ltd.) is utilized for weaving the strands.

As the SiC fibers used herein, it is advantageous to use high-purity SiC fibers.

(2) Carbonaceous Material Forming Step

The aggregate obtained in the above-described step is placed in a CVD furnace of pyrolytic carbon, and the pyrolytic carbon is deposited in interstices between the SiC fibers. At that time, using propane as a raw material and hydrogen as a carrier gas, the pyrolytic carbon is deposited in the interstices between the SiC fibers under conditions of about 1,700° C. for about 1 hour, thereby obtaining a fiber-reinforced carbonaceous substrate having a thickness of 1 mm and containing a carbonaceous material in an amount of 20% by mass.

(3) SiC Layer Forming Step

A surface of the fiber-reinforced carbonaceous substrate obtained in the above-described step is converted to SiC by reaction with an SiO gas in a reaction furnace. The SiO gas is generated from a source mounted in the furnace, in which an SiC powder and an $SiO_2$ powder are mixed, and the conversion can be suitably performed at a reaction temperature of 1,900° C., atmospheric pressure and a reaction time of 1 hour in an argon atmosphere. A CVR-SiC layer has a thickness of 10 μm.

(4) CVD-SiC Deposition Step

The tubular body according to the exemplary embodiment can be produced by the above-described steps (1) to (3). However, in order to more increase airtightness, a CVD-SiC layer is further deposited on the reaction-converted SiC surface. The above-described intermediate product is placed in a CVD furnace, and film formation is performed at 1,350° C. using a methyltrichlorosilane gas. CVD-SiC layer has a thickness of 20 μm.

The tubular body according to the exemplary embodiment can be obtained by the above-described method. An example using this tubular body as a cladding tube 1 for a nuclear fuel 2 is shown in FIG. 1.

While the present invention has been shown and described with reference to certain exemplary embodiments thereof, it will be understood by those skilled in the art that various changes in form and details may be made therein without departing from the spirit and scope of the invention as defined by the appended claims.

What is claimed is:

1. A tubular body comprising:
    a tubular fiber-reinforced carbonaceous substrate having an outer surface and comprising:
        an aggregate formed of ceramic fibers; and
        a carbonaceous material filled in interstices between the ceramic fibers;
    a CVR-SiC layer formed at least on the outer surface of the tubular fiber-reinforced carbonaceous substrate, and a boundary region between the fiber-reinforced carbonaceous substrate and the CVR-SiC layer; wherein an amount of silicon decreases from the boundary region to an inside of the fiber-reinforced carbonaceous substrate; and
    a CVD-SiC layer formed on the CVR-SiC layer,
    wherein the carbonaceous material includes pyrolytic carbon or glassy carbon, and
    wherein the aggregate has a tubular shape in which the ceramic fibers are wound using a winding method.

2. The tubular body according to claim 1,
wherein a mass ratio of the ceramic fibers to the fiber-reinforced carbonaceous substrate ranges from about 10% to about 50%.

3. The tubular body according to claim 1,
wherein the tubular body is used as a nuclear fuel cladding tube.

4. The tubular body according to claim 1,
wherein a thickness of the fiber-reinforced carbonaceous substrate ranges from about 0.3 mm to about 2 mm.

5. The tubular body according to claim 1,
wherein raw material for the ceramic fibers includes SiC.

6. The tubular body according to claim 1,
wherein raw material for the ceramic fibers includes carbon.

7. The tubular body according to claim 1,
wherein raw material for the ceramic fibers includes ZrC.

8. A tubular body, comprising:
    a tubular fiber-reinforced carbonaceous substrate having an outer surface and comprising:
        an aggregate formed of ceramic fibers; and
        a carbonaceous material filled in interstices between the ceramic fibers;
    a CVR-SiC layer formed at least on the outer surface of the tubular fiber-reinforced carbonaceous substrate, and a boundary region between the fiber-reinforced carbonaceous substrate and the CVR-SiC layer; wherein an amount of silicon decreases from the boundary region to an inside of the fiber-reinforced carbonaceous substrate; and
    a CVD-SiC layer formed on the CVR-SiC layer,
    wherein the carbonaceous material includes pyrolytic carbon or glassy carbon, and
    wherein the aggregate has a hollow mesh body which is formed by weaving strands comprising the ceramic fibers into a braid form.

9. The tubular body according to claim 8,
wherein a mass ratio of the ceramic fibers to the fiber-reinforced carbonaceous substrate ranges from about 10% to about 50%.

10. The tubular body according to claim 8,
wherein the tubular body is used as a nuclear fuel cladding tube.

11. The tubular body according to claim 8,
wherein a thickness of the fiber-reinforced carbonaceous substrate ranges from about 0.3 mm to about 2 mm.

12. The tubular body according to claim 8,
wherein raw material for the ceramic fibers includes SiC.

13. The tubular body according to claim 8,
wherein raw material for the ceramic fibers includes carbon.

14. The tubular body according to claim 8,
wherein raw material for the ceramic fibers includes ZrC.

* * * * *